(12) United States Patent
Suzuki

(10) Patent No.: US 11,855,634 B2
(45) Date of Patent: Dec. 26, 2023

(54) COMMUNICATION SYSTEM AND LAYOUT METHOD OF COMMUNICATION SYSTEM

(71) Applicant: YAZAKI CORPORATION, Tokyo (JP)

(72) Inventor: Masashi Suzuki, Makinohara (JP)

(73) Assignee: YAZAKI CORPORATION, Tokyo (JP)

( * ) Notice: Subject to any disclaimer, the term of this patent is extended or adjusted under 35 U.S.C. 154(b) by 0 days.

(21) Appl. No.: 17/723,465

(22) Filed: Apr. 19, 2022

(65) Prior Publication Data

US 2022/0345134 A1 Oct. 27, 2022

(30) Foreign Application Priority Data

Apr. 21, 2021 (JP) ................................ 2021-072003

(51) Int. Cl.
*H03K 19/17736* (2020.01)
*G06F 13/40* (2006.01)
*H03K 19/173* (2006.01)

(52) U.S. Cl.
CPC ... *H03K 19/17744* (2013.01); *G06F 13/4068* (2013.01); *H03K 19/1733* (2013.01); *H03K 19/1774* (2013.01)

(58) Field of Classification Search
CPC ......... H03K 19/1733; H03K 19/17735; H03K 19/17736; H03K 19/1774; H03K 19/17744; H03K 19/17748; G06F 13/10; G06F 13/102; G06F 13/12; G06F 13/122; G06F 13/42; G06F 13/4221
See application file for complete search history.

(56) References Cited

U.S. PATENT DOCUMENTS

| | | | | |
|---|---|---|---|---|
| 2004/0264227 | A1* | 12/2004 | Kojima | G11C 29/12015 365/45 |
| 2005/0172059 | A1 | 8/2005 | Yoshimura et al. | |
| 2014/0122833 | A1* | 5/2014 | Davis | G06F 9/44505 712/E9.002 |
| 2015/0310934 | A1* | 10/2015 | Ota | G11C 29/028 714/721 |
| 2022/0126767 | A1* | 4/2022 | Hiramatsu | B60R 16/03 |
| 2022/0345134 | A1* | 10/2022 | Suzuki | H03K 19/1733 |
| 2023/0120652 | A1* | 4/2023 | Stevens | G06F 9/4406 710/313 |

FOREIGN PATENT DOCUMENTS

| | | |
|---|---|---|
| JP | 2005-196486 A | 7/2005 |
| JP | 2015-18694 A | 1/2015 |
| JP | 2017-117381 A | 6/2017 |

* cited by examiner

*Primary Examiner* — Jason M Crawford
(74) *Attorney, Agent, or Firm* — KENEALY VAIDYA LLP

(57) ABSTRACT

A communications system includes: a control device; a standard proxy input/output circuit configured to control a standard electric device; and an extension proxy input/output circuit configured to control an extension electric device. The control device and the standard proxy input/output circuit are provided on one substrate, and the control device and the extension proxy input/output circuit are connected to each other via an electric wire.

3 Claims, 2 Drawing Sheets

COMMUNICATION SYSTEM AND LAYOUT METHOD OF COMMUNICATION SYSTEM

CROSS-REFERENCE TO RELATED APPLICATIONS

This application is based on and claims the benefit of priority of Japanese Patent Application No. 2021-072003 filed on Apr. 21, 2021, the entire contents of which are incorporated herein by reference.

FIELD

The present disclosure relates to a communication system and a layout method of a communication system.

BACKGROUND

As a communication system, for example, an extension connector unit of JP-A-2015-018694 is proposed. The extension connector unit of JP-A-2015-018694 connects an extension input connector of an extension module to an extension output connector of a base module, when connecting a load with the number of circuits that exceeds the number of pins of the output connector of the base module to a control bus. As a result, the load can be distributed and connected to the output connectors of the base module and the extension module.

SUMMARY

In the above-mentioned extension connector unit, the base module and the extension module are arranged on the same plane and connected to each other by a connector. Therefore, there is a problem that a large arrangement space that can accommodate both the base module and the extension module arranged on the same plane is required.

The present disclosure is made in view of the above circumstances, and an object thereof is to provide a communication system that achieves reduction of space and a layout method of a communication system.

The present disclosure provides a communications system including: a control device; a standard proxy input/output circuit configured to communicate with the control device and control a standard electric device; and an extension proxy input/output circuit configured to communicate with the control device and control an extension electric device, wherein the control device includes: a first clock terminal configured to allow a clock to be output therefrom; a first input terminal configured to allow an input signal to be input thereto; a first output terminal configured to allow an output signal to be output therefrom; and a plurality of first selector terminals, each of the plurality of first selector terminals being configured to allow a selector signal to be output therefrom, the selector signal selecting a communication destination, wherein each of the standard proxy input/output circuit and the extension proxy input/output circuit includes: a second clock terminal connected to the first clock terminal, the second clock terminal being configured to allow the clock to be input thereto; a second output terminal connected to the first input terminal, the second output terminal being configured to allow the input signal input to be output therefrom; a second input terminal connected to the first output terminal, the second input terminal being configured to allow the output signal to be input thereto; and a second selector terminal connected to a corresponding one of the plurality of first selector terminals, wherein the second selector terminal of the standard proxy input/output circuit and the second selector terminal of the extension proxy input/output circuit are connected to one of the plurality of first selector terminals and another of the plurality of first selector terminals, respectively, wherein each of the standard proxy input/output circuit and the extension proxy input/output circuit is configured to communicate with the control device in synchronization with the clock in a case in which the selector signal is input to the second selector terminal, wherein the control device and the standard proxy input/output circuit are provided on one substrate, and wherein the control device and the extension proxy input/output circuit are connected to each other via an electric wire.

The present disclosure provides a layout method of a communication system, the communication system including a control device, a standard proxy input/output circuit configured to communicate with the control device and control a standard electric device, and an extension proxy input/output circuit configured to communicate with the control device and control an extension electric device, the layout method including: arranging the control device and the standard proxy input/output circuit on one substrate; arranging the one substrate and the extension proxy input/output circuit in separated locations; and connecting the one substrate and the extension proxy input/output circuit with an electric wire.

The present disclosure can provide a communication system that achieves reduction of space and a layout method of a communication system.

The present disclosure is briefly described above. Details of the present disclosure will be further clarified by reading an aspect (hereinafter, referred to as an "embodiment") for implementing the invention to be described below with reference to the accompanying drawings.

DETAILED DESCRIPTION

Specific embodiments according to the present disclosure will be described below with reference to the accompanying drawings.

(First Embodiment)

Figure 1:
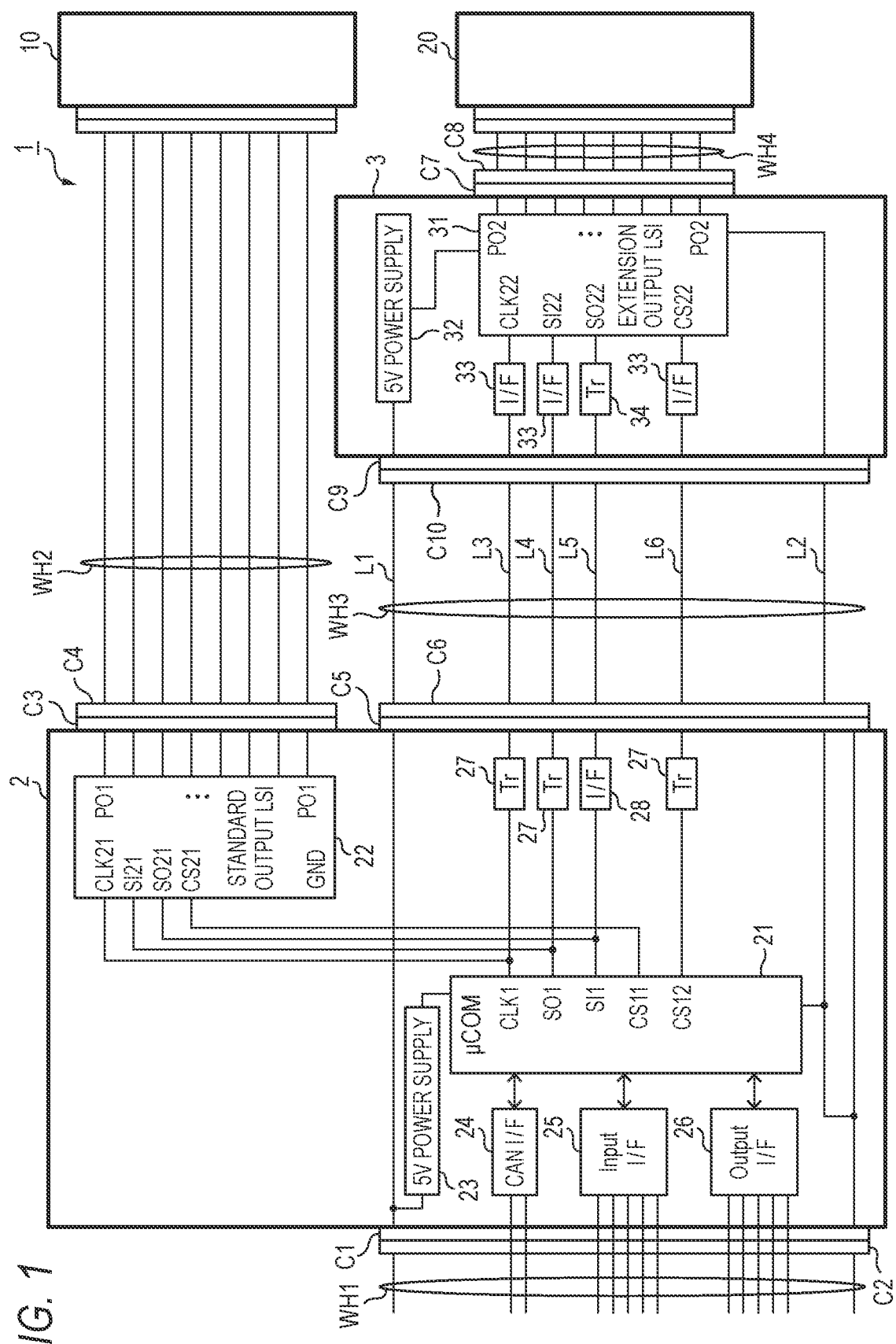
FIG. 1 is a circuit diagram showing a communication system according to a first embodiment.

First, a first embodiment will be described with reference to FIG. 1. FIG. 1 is a circuit diagram showing a communication system 1 according to the first embodiment. The communication system 1 of the present embodiment is mounted on a vehicle. The communication system 1 includes a base substrate 2 and an extension substrate 3. The base substrate 2 is provided with a microcomputer (hereinafter abbreviated as "μCOM") 21 as a control device, a standard output large scale integration (LSI) 22 as a standard proxy input/output circuit, and a 5V power supply 23.

The μCOM 21 includes a memory (not shown) such as a read only memory (ROM) or a random access memory (RAM), and is constituted by a central processing unit (CPU) that operates according to a program stored in the memory.

The μCOM 21 is connected to a CAN interface (I/F) 24 and is provided so as to be capable of CAN communication with a higher-level control device (not shown). The μCOM 21 is connected to an input I/F 25 and an output I/F 26 so as to be capable of inputting to and output from an external device. The CAN I/F 24, the input I/F 25, and the output I/F 26 are provided on the base substrate 2, and are all connected to a connector C1, which is also provided on the base substrate 2. The connector C1 is connected to a connector C2, which is attached to a terminal of a wire harness WH1. The wire harness WH1 connects the μCOM 21 to the higher-level control device or the external device (not shown).

The μCOM 21 includes a first clock terminal CLK1 from which a clock is output, a first output terminal SO1 from which an output signal is output, a first input terminal SI1 to which an input signal is input, and two first chip selector terminals CS11 and CS12 as first selector terminals from which Lo level selector signals that specify or select communication destinations are output.

The standard output LSI 22 performs serial peripheral interface (SPI) communication with the μCOM 21. The standard output LSI 22 includes a plurality of output circuits (not shown) for supplying a drive signal to a standard electric device 10, and controls the output circuits according to the communication with the μCOM 21 to control the standard electric device 10. The standard electric device 10 is an electric device such as an LED or a relay coil that is commonly mounted on a vehicle to be mounted. The standard output LSI 22 includes a second clock terminal CLK21 connected to the first clock terminal CLK1 and to which a clock is input, a second input terminal SI21 connected to the first output terminal SO1 and to which an output signal output from the μCOM 21 is input, a second output terminal SO21 connected to the first input terminal SI1 and from which an input signal input to the μCOM 21 is output, and a second chip selector terminal CS21 connected to the first chip selector terminal CS11.

The standard output LSI 22 is provided with a plurality of output terminals PO1 connected to the plurality of output circuits (not shown) described above. The output terminals PO1 are connected to a connector C3 provided on the base substrate 2. The connector C3 is connected to a connector C4, which is attached to a terminal of a wire harness WH2. The standard output LSI 22 and the standard electric device 10 are connected to each other by the wire harness WH2.

The first clock terminal CLK1, the first output terminal SO1, and the first chip selector terminal CS12 of the μCOM 21 are each connected to a plurality of electric wire terminals (not shown) constituting a connector C5 via an output transistor (Tr) 27, respectively. The output Tr 27 and the connector C5 are provided on the base substrate 2. The first input terminal SI1 of the μCOM 21 is connected to the electric wire terminals constituting the connector C5 via an I/F 28 constituted by a resistor or the like. The I/F 28 is also provided on the base substrate 2. The connector C5 is connected to a connector C6, which is attached to a terminal of a wire harness WH3 as an electric wire. The wire harness WH3 connects the μCOM 21 to an extension output LSI 31 described later.

The 5V power supply 23 generates 5V from a power supply supplied via the wire harness WH1 and supplies the generated 5V to the μCOM 21 and the standard output LSI 22.

The extension substrate 3 is equipped with the extension output LSI 31 as an extension proxy input/output circuit and a 5V power supply 32. The extension output LSI 31 includes a plurality of output circuits (not shown) for supplying a drive signal to an extension electric device 20, and controls the output circuits according to communication with the μCOM 21 to control the extension electric device 20. The extension electric device 20 is an electric device that is selectively mounted according to a specification of the vehicle to be mounted. The extension electric device 20 may be attached immediately before shipment of the vehicle, or may be retrofitted after shipment. When the extension electric device 20 is not mounted on the vehicle to be mounted, the extension substrate 3 is not connected to the base substrate 2 and is not mounted on the vehicle to be mounted.

The extension output LSI 31 includes a second clock terminal CLK22 connected to the first clock terminal CLK1 and to which a clock is input, a second input terminal SI22 connected to the first output terminal SO1 and to which an output signal output from the μCOM 21 is input, a second output terminal SO22 connected to the first input terminal SI1 and from which an input signal to be input to the μCOM 21 is output, and a second chip selector terminal CS22 connected to the first chip selector terminal CS12.

The extension output LSI 31 is provided with a plurality of output terminals PO2 connected to the plurality of output circuits (not shown) described above. The output terminals PO2 are connected to a connector C7 provided on the extension substrate 3. The connector C7 is connected to a connector C8, which is attached to a terminal of a wire harness WH4. The extension output LSI 31 and the extension electric device 20 are connected to each other by the wire harness WH4.

The second clock terminal CLK22, the second input terminal SI22, and the second chip selector terminal CS22 of the extension output LSI 31 are each connected to a connector C9 via an I/F 33, respectively. The I/F 33 and the connector C9 are provided on the extension substrate 3. The second output terminal SO22 of the extension output LSI 31 is connected to the connector C9 via an output Tr 34. The output Tr 34 is also provided on the extension substrate 3. The connector C9 is connected to a connector C10, which is attached to the other terminal of the wire harness WH3.

The wire harness WH3 includes a power supply line L1, a ground line L2, a clock line L3, an output line L4, an input line L5, and a selector line L6. The power supply line L1 connects power supply lines between the base substrate 2 and the extension substrate 3. The ground line L2 connects ground lines between the base substrate 2 and the extension substrate 3. The clock line L3 connects the first clock terminal CLK1 of the μCOM 21 to the second clock terminal CLK22 of the extension output LSI 31, so that a clock flows. The output line L4 connects the first output terminal SO1 of the μCOM 21 to the second input terminal SI22 of the extension output LSI 31, so that an output signal flows. The input line L5 connects the first input terminal SI1 of the μCOM 21 to the second output terminal SO22 of the extension output LSI 31, so that an input signal flows. The selector line L6 connects the first chip selector terminal CS12 of the μCOM 21 to the second chip selector terminal CS22 of the extension output LSI 31, so that a selector signal flows.

The 5V power supply 32 generates 5V from a power supply supplied via the power supply line L1 of the wire harness WH3 and supplies the generated 5V to the extension output LSI 31.

Next, operations of the communication system 1 having the above-described configuration will be described. First, the μCOM 21 communicates with the higher-level control device by CAN communication, and communicates with the standard output LSI 22 and the extension output LSI 31 according to a communication result. First, a case where the μCOM 21 communicates with the standard output LSI 22 will be described. In this case, the μCOM 21 outputs a clock from the first clock terminal CLK1 and outputs an Lo level selector signal from the first chip selector terminal CS11. Further, the μCOM 21 outputs a serial output signal from the first output terminal SO1 in synchronization with the clock.

The output signal from the μCOM 21 is input to the second input terminals SI21 and SI22 of both the standard output LSI 22 and the extension output LSI 31. When the Lo level selector signal is input from the second chip selector terminal CS21, the standard output LSI 22 receives the output signal input to the second input terminal SI21 in synchronization with the clock for a corresponding bit. The standard output LSI 22 converts the received serial output signal into a parallel signal and outputs the parallel signal from the output terminal PO1 to control the standard electric device 10.

Since the selector signal from the second chip selector terminal CS22 is not input to the extension output LSI 31, the output signal input to the second input terminal SI22 is ignored.

The standard output LSI 22 outputs, from the second output terminal SO21, an input signal indicating that the output signal in synchronization with the clock is received. The input signal output from the standard output LSI 22 is input to the first input terminal SI1 of the μCOM 21. While outputting the selector signal from the first chip selector terminal CS11, the μCOM 21 receives the input signal input to the first input terminal SI1 as an input from the standard output LSI 22.

Next, a case where the μCOM 21 communicates with the extension output LSI 31 will be described. In this case, the μCOM 21 outputs a clock from the first clock terminal CLK1 and outputs a selector signal from the second chip selector terminal CS12. Further, the μCOM 21 outputs a serial output signal from the first output terminal SO1 in synchronization with the clock.

The output signal from the μCOM 21 is input to the second input terminals SI21 and SI22 of both the standard output LSI 22 and the extension output LSI 31. When the Lo level selector signal is input, the extension output LSI 31 receives the output signal input to the second input terminal SI22 in synchronization with the clock for a corresponding bit. The extension output LSI 31 converts the received serial output signal into a parallel signal and outputs the parallel signal from the output terminal PO2 to control the extension electric device 20.

Since the selector signal from the second chip selector terminal CS21 is not input to the standard output LSI 22, the output signal input to the second input terminal SI21 is ignored.

The extension output LSI 31 outputs, from the second output signal SO22, an input signal indicating that an output signal in synchronization with the clock is received. The input signal output from the extension output LSI 31 is input to the first input terminal SI1 of the μCOM 21. While outputting the selector signal from the first chip selector terminal CS12, the μCOM 21 receives the input signal input to the first input terminal SI1 as an input from the extension output LSI 31.

Next, a layout method of the communication system 1 described above will be described. The base substrate 2 and the extension substrate 3 are arranged at separated locations. For example, the base substrate 2 is arranged near the standard electric device 10, and the extension substrate 3 is arranged near the extension electric device 20. The wire harness WH3 connects the base substrate 2 to the extension substrate 3.

According to the first embodiment described above, the μCOM 21 and the standard output LSI 22 are provided on the same base substrate 2, and the μCOM 21 and the extension output LSI 31 are connected to each other via the wire harness WH3. Therefore, it is not necessary to arrange the base substrate 2 and the extension substrate 3 on the same plane, and the base substrate 2 and the extension substrate 3 can be arranged at separated locations and connected by the wire harness WH3. Therefore, space can be reduced. Since the extension output LSI 31 is configured to receive the clock and the output signal from the μCOM 21 and communicate with the μCOM 21 only when the selector signal is input, the extension output LSI 31 is configured in a simple way.

(Second Embodiment)

Figure 2:
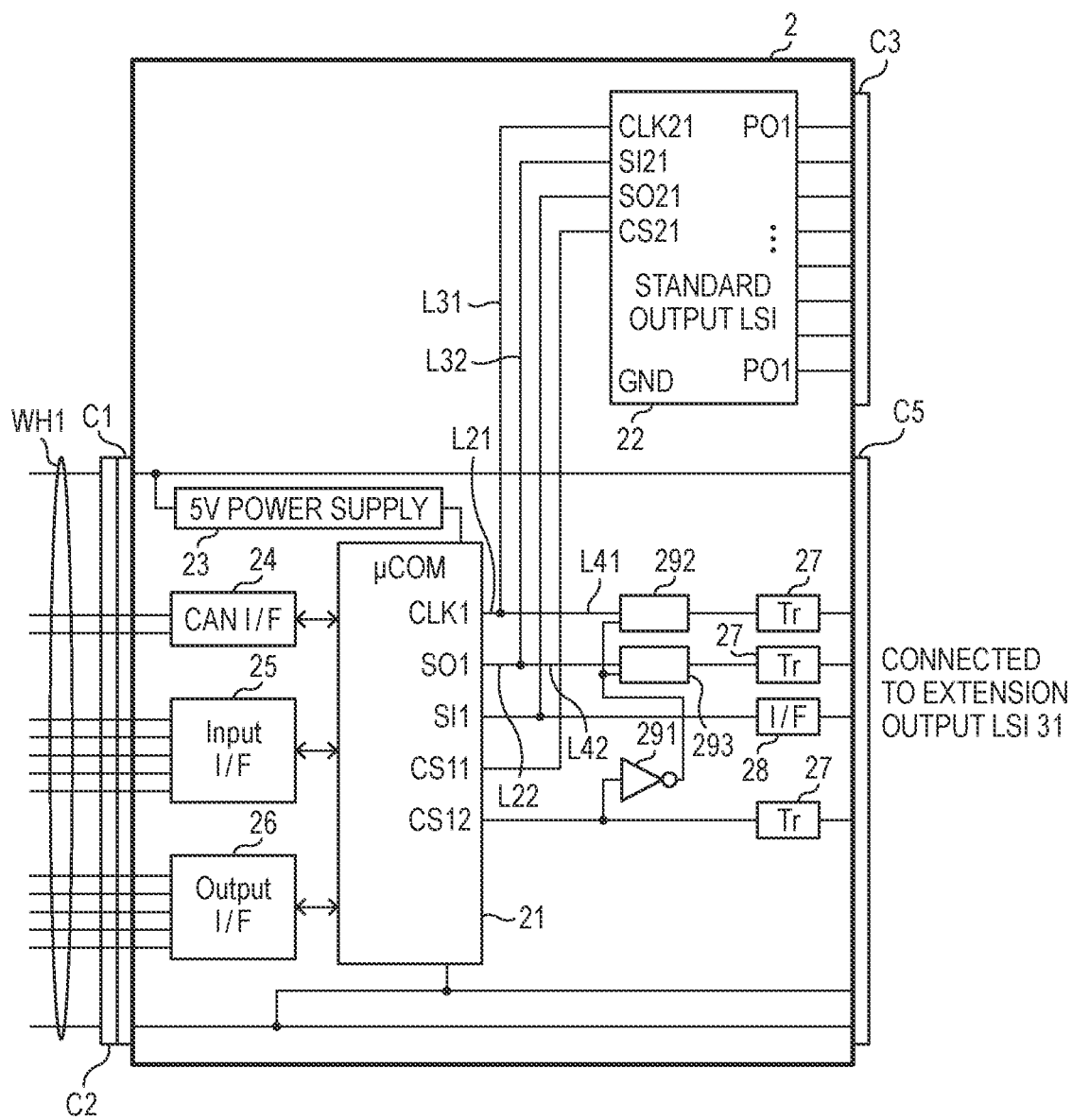
FIG. 2 is a circuit diagram showing a base substrate constituting a communication system according to a second embodiment.

Next, a second embodiment will be described with reference to FIG. 2. FIG. 2 is a configuration diagram of a base substrate constituting the communication system 1 according to the second embodiment. In FIG. 2, the same reference numerals are given to the same portions as those in FIG. 1, which has already been described in the first embodiment, and detailed description thereof will be omitted.

In the first embodiment described above, the base substrate 2 and the extension substrate 3 are connected to each other by the wire harness WH3. Therefore, in particular, when a clock or an output signal flows through the wire harness WH3, there is a problem that a risk of radiation noise due to a square wave becoming noise of a radio or the like increases. In the first embodiment, a clock and an output signal flow on the wire harness WH3 even while the μCOM 21 communicates with the standard output LSI 22.

Therefore, in the second embodiment, an NOT circuit 291 and stop circuits 292 and 293 are provided on the base substrate 2, and while the μCOM 21 communicates with the standard output LSI 22, the clock and the output signal are prevented from flowing in the wire harness WH3. The NOT circuit 291 is connected to the first chip selector terminal C12 and inverts output of the first chip selector terminal C12. That is, the NOT circuit 291 outputs a Hi level signal when an Lo level selector signal is output from the first chip selector terminal C12 in order for the μCOM 21 to communicate with the extension output LSI 31.

The stop circuit 292 is provided between the first clock terminal CLK1 and the electric wire terminals (not shown) constituting the connector C5 connected to the first clock terminal CLK1. The clock is input to one of two inputs of the stop circuit 292, and an output of the NOT circuit 291 is input to the other. The stop circuit 293 is provided between the first output terminal SO1 and the electric wire terminals (not shown) constituting the connector C5 connected to the first output terminal SO1. The output signal is input to one of two inputs of the stop circuit 293, and the output of the NOT circuit 291 is input to the other.

The stop circuits 292 and 293 are constituted by, for example, AND circuits, and the Lo level selector signal is output from the first chip selector terminal C12, and the input clock or output signal is output while the output of the NOT circuit 291 is at a Hi level. In the stop circuits 292 and 293, the selector signal is not output from the first chip selector terminal C12, and while the output of the NOT circuit 291 is at an Lo level, the output of the input clock or output signal is stopped.

As a result, the stop circuits 292 and 293 can stop the output of the clock and the output signal to the extension output LSI 31 while the selector signal is not output from the first chip selector terminal C12. Arrangement positions of the stop circuits 292 and 293 will be described in more detail. The base substrate 2 is provided with first wirings L21 and L22 connected to the first clock terminal CLK1 and the first output terminal SO1 of the μCOM 21, respectively, second wirings L31 and L32, which are branched from the first wirings L21 and L22 and connected to the standard output LSI 22, and third wirings L41 and L42, which are branched from the first wirings L21 and L22 and connected to the connector C5. The stop circuits 292 and 293 are provided on the third wirings L41 and L42, respectively.

According to the second embodiment described above, since no clock or output signal flows through the wire harness WH3 when the selector signal is not output to the extension output LSI 31, it is possible to prevent generation of noise.

According to the second embodiment described above, when the selector signal is not output to the extension output LSI 31, the clock and output signal is stopped from being output to the extension output LSI 31, and the clock and output signal is not stopped from being output to the standard output LSI 22. By arranging the stop circuits 292 and 293 on the third wirings L41 and L42, the stop circuits 292 and 293 do not stop outputting the clock and output signal to the standard output LSI 22.

The present disclosure is not limited to the above embodiments, and modifications, improvements, and the like can be made as appropriate. In addition, materials, shapes, dimensions, numbers, arrangement positions, and the like of components in the above embodiments are freely set and are not limited as long as the present disclosure can be achieved.

In the first and second embodiments described above, the output LSIs 22 and 31 provided with the output circuits are used as the standard and extension proxy input/output circuits, but the present disclosure is not limited thereto. An input LSI provided with an input circuit to which states (switch on, off, and the like) of the standard electric device 10 and the extension electric device 20 may also be used as the standard and extension proxy input/output circuits.

Here, features of the above-mentioned embodiments of the communication system and the layout method of a communication system according to the present disclosure are briefly summarized and listed below in [1] to [4], respectively.

[1] A communications system (1), including:
a control device (21);
a standard proxy input/output circuit (22) configured to communicate with the control device (21) and control a standard electric device (10); and
an extension proxy input/output circuit (31) configured to communicate with the control device (21) and control an extension electric device (20),
wherein the control device (21) includes:
  a first clock terminal (CLK1) configured to allow a clock to be output therefrom;
  a first input terminal (SI1) configured to allow an input signal to be input thereto;
  a first output terminal (SO1) configured to allow an output signal to be output therefrom; and
  a plurality of first selector terminals (CS11, CS12), each of the plurality of first selector terminals (CS11, CS12) being configured to allow a selector signal to be output therefrom, the selector signal specifying a communication destination,
wherein each of the standard proxy input/output circuit (22) and the extension proxy input/output circuit (31) includes:
  a second clock terminal (CLK21, CLK22) connected to the first clock terminal (CLK1), the second clock terminal (CLK21, CLK22) being configured to allow the clock to be input thereto;
  a second output terminal (SO21, SO22) connected to the first input terminal (SI1), the second output terminal (SO21, SO22) being configured to allow the input signal input to be output therefrom;
  a second input terminal (SI21, SI22) connected to the first output terminal (SO1), the second input terminal (SI21, SI22) being configured to allow the output signal to be input thereto; and
  a second selector terminal (CS21, CS22) connected to a corresponding one of the plurality of first selector terminals (CS11, CS12),
wherein the second selector terminal (CS21) of the standard proxy input/output circuit (22) and the second selector terminal (CS22) of the extension proxy input/output circuit (31) are connected to one of the plurality of first selector terminals (CS11, CS12) and another of the plurality of first selector terminals (CS11, CS12), respectively,
wherein each of the standard proxy input/output circuit (22) and the extension proxy input/output circuit (31) is configured to communicate with the control device (21) in synchronization with the clock in a case in which the selector signal is input to the second selector terminal (CS21, CS22),
wherein the control device (21) and the standard proxy input/output circuit (22) are provided on one substrate (2), and
wherein the control device (21) and the extension proxy input/output circuit (31) are connected to each other via an electric wire (WH3).

[2] The communication system (1) according to [1],
wherein the one substrate (2) is provided with an electric wire terminal for connecting to the electric wire (WH3), and
wherein the communication system (1) further comprises a stop circuit (292, 293) configured to stop outputting the clock and the output signal from the electric wire terminal to the extension proxy input/output circuit (31) in a case in which the selector signal is not output from the first selector terminal (CS12) connected to the extension proxy input/output circuit (31).

[3] The communication system (1) according to [2],
wherein the substrate (2) is provided with a first wiring (L21, L22) connected to each of the first clock terminal (CLK1) and the first output terminal (SO1), a second wiring (L31, L32) branched from the first wiring (L21, L22) and connected to the standard proxy input/output circuit (22), and a third wiring (L41, L42) branched from the first wiring (L21, L22) and connected to the electric wire terminal, and
wherein the stop circuit (292, 293) is provided on the third wiring (L41, L42).

[4] A layout method of a communication system (1), the communication system (1) including a control device (21), a standard proxy input/output circuit (22) configured to communicate with the control device (21) and control a standard electric device (10), and an extension proxy input/output circuit (31) configured to communicate with the control device (21) and control an extension electric device (20), the layout method including:
arranging the control device (21) and the standard proxy input/output circuit (22) on one substrate (2);
arranging the substrate (2) and the extension proxy input/output circuit (31) in separated locations; and connecting the substrate (2) and the extension proxy input/output circuit (31) with an electric wire (WH3).

According to the communication system and the layout method of a communication system having configurations in the above [1] and [4], it is not necessary to arrange the substrate on which the standard proxy input/output circuit is mounted and a substrate on which the extension proxy input/output circuit is mounted on the same plane, and they can be arranged in separated locations and connected by the electric wire. Therefore, space can be reduced. Since the extension proxy input/output circuit is configured to receive the clock and the output signal from the control device and communicate with the control device only in a case in which the selector signal is input, a simplified configuration can be achieved.

According to the communication system having a configuration in the above [2], since no clock or output signal flows through the electric wire in a case in which the selector signal is not output to the extension proxy input/output circuit, generation of noise can be prevented.

According to the communication system having a configuration in the above [3], in the case in which the selector signal is not output to the extension proxy input/output circuit, the clock and the output signal can be stopped from being outputting to the extension proxy input/output circuit, and the clock and the output signal are not stopped from being outputting to the standard proxy input/output circuit.

The invention claimed is:

1. A communications system comprising:
   a control device;
   a standard proxy input/output circuit configured to communicate with the control device and control a standard electric device; and
   an extension proxy input/output circuit configured to communicate with the control device and control an extension electric device,
   wherein the control device comprises:
      a first clock terminal configured to allow a clock to be output therefrom;
      a first input terminal configured to allow an input signal to be input thereto;
      a first output terminal configured to allow an output signal to be output therefrom; and
      a plurality of first selector terminals, each of the plurality of first selector terminals being configured to allow a selector signal to be output therefrom, the selector signal specifying a communication destination,
   wherein each of the standard proxy input/output circuit and the extension proxy input/output circuit comprises:
      a second clock terminal connected to the first clock terminal, the second clock terminal being configured to allow the clock to be input thereto;
      a second output terminal connected to the first input terminal, the second output terminal being configured to allow the input signal input to be output therefrom;
      a second input terminal connected to the first output terminal, the second input terminal being configured to allow the output signal to be input thereto; and
      a second selector terminal connected to a corresponding one of the plurality of first selector terminals,
   wherein the second selector terminal of the standard proxy input/output circuit and the second selector terminal of the extension proxy input/output circuit are connected to one of the plurality of first selector terminals and another of the plurality of first selector terminals, respectively,
   wherein each of the standard proxy input/output circuit and the extension proxy input/output circuit is configured to communicate with the control device in synchronization with the clock in a case in which the selector signal is input to the second selector terminal,
   wherein the control device and the standard proxy input/output circuit are provided on one substrate, and
   wherein the control device and the extension proxy input/output circuit are connected to each other via an electric wire.

2. The communication system according to claim 1, wherein the one substrate is provided with an electric wire terminal for connecting to the electric wire, and
   wherein the communication system further comprises a stop circuit configured to stop outputting the clock and the output signal from the electric wire terminal to the extension proxy input/output circuit in a case in which the selector signal is not output from the first selector terminal connected to the extension proxy input/output circuit.

3. The communication system according to claim 2, wherein the substrate is provided with a first wiring connected to each of the first clock terminal and the first output terminal, a second wiring branched from the first wiring and connected to the standard proxy input/output circuit, and a third wiring branched from the first wiring and connected to the electric wire terminal, and
   wherein the stop circuit is provided on the third wiring.

* * * * *